US011414782B2

(12) United States Patent
Hu

(10) Patent No.: US 11,414,782 B2
(45) Date of Patent: Aug. 16, 2022

(54) METHOD OF SEPARATING A FILM FROM A MAIN BODY OF A CRYSTALLINE OBJECT

(71) Applicant: Bing Hu, Dallas, TX (US)

(72) Inventor: Bing Hu, Dallas, TX (US)

( * ) Notice: Subject to any disclaimer, the term of this patent is extended or adjusted under 35 U.S.C. 154(b) by 0 days.

(21) Appl. No.: 16/505,610

(22) Filed: Jul. 8, 2019

(65) Prior Publication Data
US 2020/0224332 A1 Jul. 16, 2020

Related U.S. Application Data

(60) Provisional application No. 62/791,825, filed on Jan. 13, 2019.

(51) Int. Cl.
C30B 31/22 (2006.01)
C30B 33/04 (2006.01)
H01L 21/762 (2006.01)
C30B 29/04 (2006.01)
C30B 29/40 (2006.01)
C30B 29/22 (2006.01)
C30B 29/52 (2006.01)

(52) U.S. Cl.
CPC .............. C30B 31/22 (2013.01); C30B 33/04 (2013.01); H01L 21/76254 (2013.01); C30B 29/04 (2013.01); C30B 29/225 (2013.01); C30B 29/403 (2013.01); C30B 29/52 (2013.01)

(58) Field of Classification Search
CPC .................................. C30B 31/22; C30B 29/04
See application file for complete search history.

(56) References Cited

U.S. PATENT DOCUMENTS 5,374,564 A 12/1994 Bruel
6,540,827 B1 4/2003 Levy et al.
7,859,951 B2 12/2010 Plancon
8,759,951 B2 6/2014 Mitani
(Continued)

FOREIGN PATENT DOCUMENTS

CN 101106067 A 1/2008
EP 1361298 12/2003
(Continued)

OTHER PUBLICATIONS

Tauzin, "Transfer of Two-Inch Gan Film By the Smart Cut Technology," 207th ECS Meeting, 1 page.
(Continued)

Primary Examiner — Robert M Kunemund
(74) Attorney, Agent, or Firm — Chad Peterson

(57) ABSTRACT

Methods are provided for separating a crystalline film from its main body. The method uses ion implantation to generate an ion damaged layer underneath the surface of the crystalline object. The ion damage changes the crystal structure of the ion damaged layer, so it will have different optical transmittance and absorption characteristics from the undamaged part of the crystalline object. A laser beam with a wavelength that is higher than the absorption edge of the non-ion damaged material, but within the absorption range of the ion damaged material is irradiated at or past the ion damaged layer, causing further damage to the ion damaged layer. The film can then be separated from the main body of the crystalline object.

20 Claims, 4 Drawing Sheets

(56) References Cited

U.S. PATENT DOCUMENTS

| | | | |
|---|---|---|---|
| 10,734,274 B2 | 8/2020 | Hu | |
| 2001/0009250 A1 | 7/2001 | Herman et al. | |
| 2003/0181001 A1 | 9/2003 | Aga et al. | |
| 2005/0227456 A1 | 10/2005 | Roche | |
| 2006/0205179 A1 | 9/2006 | Fournel et al. | |
| 2006/0226482 A1 | 10/2006 | Suvorov | |
| 2007/0249140 A1 | 10/2007 | Dross et al. | |
| 2008/0169508 A1 | 7/2008 | Chidambarrao et al. | |
| 2009/0035885 A1 | 2/2009 | Karlicek, Jr. et al. | |
| 2009/0061557 A1 | 3/2009 | Akiyama et al. | |
| 2009/0071394 A1 | 3/2009 | Nakahata et al. | |
| 2009/0149005 A1 | 6/2009 | Tauzin et al. | |
| 2009/0242032 A1* | 10/2009 | Yamazaki | H01L 31/072 136/261 |
| 2010/0109126 A1 | 5/2010 | Arena | |
| 2010/0311250 A1 | 12/2010 | Bedell et al. | |
| 2011/0132549 A1 | 6/2011 | Sercel et al. | |
| 2011/0156212 A1 | 6/2011 | Arena | |
| 2011/0244654 A1 | 10/2011 | Akiyama et al. | |
| 2012/0028399 A1 | 2/2012 | Moslehi et al. | |
| 2012/0119219 A1 | 5/2012 | Takado et al. | |
| 2012/0326169 A1 | 12/2012 | Sakai | |
| 2014/0252366 A1 | 9/2014 | Gao | |
| 2014/0327013 A1 | 11/2014 | Schenk et al. | |
| 2015/0368833 A1* | 12/2015 | Farah | B23K 26/53 117/58 |
| 2016/0336233 A1 | 11/2016 | Yonehara et al. | |
| 2016/0372628 A1 | 12/2016 | Henley et al. | |
| 2017/0107606 A1* | 4/2017 | Jinbo | C23C 14/12 |
| 2017/0309249 A1* | 10/2017 | Yamazaki | G09G 3/20 |
| 2017/0372965 A1* | 12/2017 | Nishibayashi | H01L 21/02433 |
| 2018/0158720 A1 | 6/2018 | Hu | |
| 2018/0330983 A1 | 11/2018 | Wang et al. | |
| 2018/0350785 A1 | 12/2018 | Fong et al. | |
| 2020/0058542 A1 | 2/2020 | Hu | |

FOREIGN PATENT DOCUMENTS

| | | |
|---|---|---|
| JP | 2002-241191 | 8/2002 |
| JP | 2006-509377 | 3/2006 |
| JP | 2007-250575 | 9/2007 |
| JP | 2008-522398 | 6/2008 |
| JP | 2011-249775 | 12/2011 |
| JP | 2015-119062 | 6/2015 |

OTHER PUBLICATIONS

Di Cioccio, "Silicon carbide on insulator formation using the Smart Cut process," Electronics Letters vol. 32 No. 12 (Jun. 6, 1996), pp. 1144-1145.
Larheche, "AlGaN / GaN HEMT structures grown on SiCOI wafers obtained by the Smart Cut™ technology," Materials Science Forum vols. 457-460 (2004), pp. 1621-1624.
Henttinen, "Transfer of Thin Si Layers by Cold and Thermal Ion-Cutting," Journal of Material Science: Materials in Electronics vol. 14 (2003), pp. 299-303.
Bouchard, "Analysis of stress intensity factors and T-stress to control crack propagation for kerf-less spalling of single crystal silicon foils," Computational Materials Science 69 (Mar. 2013), pp. 243-250.
Martini, "Epoxy-induced spalling of Silicon," Energy Procedia 27 (2012), pp. 567-572.
Bedell, "Kerf-Less Removal of Si, Ge, and III-V Layers by Controlled Spalling to Enable Low-Cost PV Technologies," IEEE Journal of Photovoltaics vol. 2 No. 2 (Apr. 2012), pp. 141-147.
Niepelt, "Kerfless exfoliated thin crystalline Si wafers with Al metallization layers for solar cells," Journal of Materials Research Nov. 2015, 36 pages.
Bedell, "Layer transfer by controlled spalling," Journal of Physics D Applied Physics 46 (Mar. 2013), 8 pages.
Bedell, "Vertical Light-Emitting Diode Fabrication by Controlled Spalling," Applied Physics Express 6 (2013), 4 pages.

Written Opinion of the International Searching Authority for PCT/CN2016/098943 (Translation); dated Dec. 19, 2016; 5 pages.
International Search Report for PCT/CN2016/098943 (Translation); dated Dec. 19, 2016; 3 pages.
Budde, "Hydrogen-Related Defects in Proton-Implanted Silicon and Germanium," Thesis, Institute of Physics and Astronomy, University of Aarhus, Denmark (Oct. 1998), 159 pages.
Amarasinghe, "Optimization of H+ Implantation Parameters for Exfoliation of 4H—SiC Films," ECS Transactions (Mar. 2013), pp. 341-348.
Goorsky (Ed.), "Ion Implantation," InTech (2012), Rijeka, Croatia, 448 pages.
Communication from European Patent Office re EP16845712, dated Mar. 20, 2019; 6 pages.
Notification of Reasons for Refusal from Japanese Patent Office re 2018-524527 (Translation), dated Jan. 8, 2019, 3 pages.
Jia, "Freestanding ultrathin single-crystalline SiC substrate by MeV H ion-slicing," Applied Physics Letters (2018), 7 pages.
Chichkov, "Femtosecond, picosecond and nanosecond laser ablation of solids," Applied Physics A (1996), 7 pages.
Ozel, "Nanosecond Pulsed Laser Processing of Ion Implanted Single Crystal Silicon Carbide Thin Layers," Physics Procedia 56 (2014), 11 pages.
Beyer, "Cold split—A new technology for kerf-less watering of Silicon," Freiberg Silicon Days 2015, 12 pages.
Sun, "Generic Incubation Law for Laser Damage and Ablation Thresholds," Journal of Applied Physics 117, 073102 (2015), 7 pages.
Barcz, "Diffusion and impurity segregation in hydrogen-implanted silicon carbide," Journal of Applied Physics (Jun. 2014), 11 pages.
Swoboda, "Laser Assisted SiC Watering Using COLD SPLIT," Material Science Forum vol. 897 (May 2017), 4 pages.
Hu, "Separation of a Functional Film from a SiC Substrate by Ion Cut without Bonding," 2018 International Flexible Electronics Technology Conference, 3 pages.
Bedell, "Layer transfer of bulk gallium nitride by controlled spalling," Journal of Applied Physics 122, 025103 (2017), 7 pages.
DesAutels, "Femtosecond Laser Damage Threshold and Nonlinear Characterization in Bulk Transparent SiC Materials," Proc. of SPIE vol. 6875, (2008), 14 pages.
Notification of Reasons for Refusal from Japanese Patent Office re 2018-524527 (Translation), dated May 22, 2019, 4 pages.
Communication from German Patent Office, dated Jul. 22, 2019, 7 pages.
International Search Report, dated Apr. 21, 2020, 2 pages.
Written Opinion of the International Searching Authority, dated Apr. 21, 2020, 6 pages.
Gupta et al., "Ultra-thin chips for high-performance flexible electronics," npj Flexible Electronics (2018).
Jayswal et al., "Overview On Flexible Electronics Technology," Journal of Advanced Computing and Communication Technologies (ISSN: 2347-2804) vol. No.5 Issue No. 3, Jun. 2017.
Cai et al., "Review on flexible photonics/electronics integrated devices and fabrication strategy," Science China Information Sciences 61, 060410 (2018).
Office Action re U.S. Appl. No. 16/201,821; dated Dec. 20, 2019; 8 pages.
Communication from Korean patent office, dated Jun. 5, 2020, 6 pages (with translation).
Office Action re U.S. Appl. No. 15/868,300; dated Sep. 9,2019; 20 pages.
Notice of Allowance re U.S. Appl. No. 15/868,300; dated Mar. 23, 2020; 9 pages.
Office Action re U.S. Appl. No. 16/201,821; dated Apr. 1, 2020; 14 pages.
"Controlled spalling of bulk and free-standing gallium nitride substrates," Semiconductor Today, vol. 12 Issue 7 (Sep. 2017).
"Thinking Thin Brings New Layering and Thermal Abilities to the Semiconductor Industry," AIP Publishing (Jul. 11, 2017).
"Controlled spalling fabricates thin films of gallium nitride and could drastically change semiconductor industry," The American Ceramic Society (Jul. 18, 2017).

(56) References Cited

OTHER PUBLICATIONS

Office Action re U.S. Appl. No. 16/201,821; dated Dec. 9, 2020; 10 pages.
Office Action re U.S. Appl. No. 16/201,821; dated Jun. 23, 2021; 12 pages.
Office Action re U.S. Appl. No. 16/904,516; dated Oct. 4, 2021; 10 pages.
Communication from Korean patent office, dated Dec. 29, 2020, 7 pages (with translation).
Communication from Japanese patent office re 2019-184892, dated Dec. 16, 2020, 3 pages (with translation).
Communication from Japanese patent office re 2019-184892, dated Jul. 8, 2021, 3 pages (with translation).

* cited by examiner

METHOD OF SEPARATING A FILM FROM A MAIN BODY OF A CRYSTALLINE OBJECT

CROSS-REFERENCE TO RELATED APPLICATIONS

The present application claims the benefit of U.S. provisional patent application Ser. No. 62/791,825, titled "METHOD OF SEPARATING A FILM FROM A MAIN BODY OF A CRYSTALLINE OBJECT," filed Jan. 13, 2019, which is incorporated by reference herein in its entirety.

BACKGROUND

The present disclosure is related to the field of manufacturing electronic devices, and in particular, to separating a film from a main body of a crystalline object.

Semiconductor materials are widely used for making electronic devices. The applications of semiconductor materials are directly related to our daily lives and in technology. Semiconductor materials have evolved from silicon or germanium (for example) in the first generation to more recent third generation materials such as silicon carbide (SiC) and gallium nitride (GaN). All electronic devices based on semiconductors are built on semiconductor substrates, and the pricing of electronic devices is a function of the cost of substrates. Generally, the first and second generation semiconductor substrates are grown from their respective melt, while the third generation semiconductor substrates are mostly grown from vapors, such as chemical vapor deposition (CVD), metalorganic chemical vapor deposition (MOCVD), physical vapor transport (PVT), hydride vapor phase epitaxy (HVPE), and such. The substrate costs of third generation semiconductor are much higher than in previous generations. As such, reducing the cost of substrates will benefit consumers of electronic devices, and prompt more applications, especially those based on the 3rd generation semiconductors.

Smart-Cut, Controlled spalling, Smart-Liftoff [1], and Cold Split are a few techniques that can separate film from semiconductor substrates. Smart-Cut uses proton implantation to generate an ion damaged layer underneath the surface of the donor wafer. Then an acceptor wafer is bonded to the donor wafer on the surface through which protons were implanted. The donor and acceptor wafer are separated at the ion damaged layer after temperature annealing. However, Smart-Cut is problematic if the donor wafer is a hard material, such as SiC. Because of the hardness of SiC, getting the surface of the SiC substrate to meet the bonding requirements is very challenging. In addition, the separated surface needs further processing, e.g., polishing, to repair damage to the surface and to allow electronic devices to be formed thereon.

Controlled spalling applies a stressor on the surface of a wafer. By initiating a crack at the edge of the wafer and pulling a tape that is adhesive on the stressor, a thin film can be lifted off from the wafer. The thickness of the film is controlled by stress and the thickness of the stressor in controlled spalling. This causes variations of thickness in lifted-off films and inconvenience in large scale production.

Smart-Liftoff and Cold Split use similar mechanisms to separated thin and thick films from wafers respectively. Both techniques generate a damaged layer underneath the surface of a substrate prior to separation and then spall the film off the substrate by applying a stressor on the film. Smart-Liftoff is described in detail in U.S. Patent Publication No. US20180158720A1, which is hereby incorporated by reference in its entirety. Smart-Liftoff uses ion implantation to generate an ion damaged layer while Cold Split uses a pulse laser to generate the damaged layer. The wavelength of the laser used in Cold Split has to be longer than the absorption edge of the substrate to be separated, so the laser beam can penetrate and be focused inside of the substrate. Since the photon energy of laser is lower than the band gap of the materials, the electrons in the materials are excited by multi-photons. Although the surface roughness of the split surface separated by Cold Split was in the range of a few micrometers, some sub surface (separation surface) damage (SSD) may occur within 20 μm along the direction of the laser irradiation. The minimum thickness of the film achieved by Cold Split is reported to be 50 μm.

When Smart-Liftoff is used for separating a film from a SiC substrate, high ion energy is preferred because ions with the same energy stop at a shallower depth in SiC than in most other materials. However, ion implanters capable of providing ion beams of energy higher than 500 keV and ion current above 1 milliamp are presently limited. In addition, lower energy ions penetrate to a shallower depth and may cause more surface damage, such as blisters and exfoliations. If a lower energy ion implanter is used, the implanted ion dose needs to be reduced to prevent such surface damage. Alternatively, if a high energy ion implanter with low current capability is used, a low ion dose can save a lot of ion implantation process time. A low ion dose requires the use of high stress and a thicker layer of stressor. The separated film will thus have higher curvature compared to a film separated after a high ion dose. This may cause difficulties in subsequent processes. The high stress and thick stressor layer may also cause a higher amount of stressor residue to be left on the film after the stressor is removed. In addition, because it causes less structural damage, a low ion dose increases the difficulty of film separation. Controlled spalling similarly requires a thick stressor, as there is no damaged layer.

Another method used in film separation is laser lift off. It is mostly used to separate GaN film from sapphire substrate. The optical absorption edge of GaN located at a longer wavelength than that of sapphire, and a laser beam with wavelength that is shorter than GaN's absorption edge but longer than that sapphire's is used to separate GaN film from sapphire. The laser beam can pass through sapphire substrate and mostly be absorbed by GaN at GaN and sapphire interface. The GaN film is thus separated from sapphire substrate. This method is only useable for epitaxy and substrate materials with different absorption edges from each other.

There remains a need for a film separation method that works on very hard substrates, such as SiC, GaN, or diamond, especially for films under about 50 μm, and/or in situations where it is beneficial or necessary to use a low implanted ion dose and a thick stressor is undesirable.

SUMMARY

In accordance with the foregoing objectives and others, exemplary methods and systems are disclosed herein to separate films from crystalline objects. Ions, e.g., protons, are first implanted into a crystalline object through a flat surface (e.g., a top surface) to form an ion damaged layer underneath the surface of the crystalline object. Optionally, electronic devices or an epitaxial layer may be fabricated or deposited on the film prior to or after ion implantation. The ion damaged layer may be heat annealed to enhance the effect of the ion damage [2,3].

When ions are implanted into the crystalline object (e.g., semiconductor wafer), chemical bonds may break, and new bonds may form. For example, protons implanted into silicon can break Si—Si bonds and form Si—H bonds. This structural change causes changes in the optical transmittance and absorption of the ion damaged layers of the wafer. The ion damaged materials will become more absorptive, especially at wavelengths closer to the absorption edge of the object's original materials [4,5]. A laser focused on the ion damaged layer will cause further destruction. Based on the laser pulse duration, the laser damage to the materials is caused by different mechanisms and has different impacts. When the laser pulse duration is in nanoseconds, the electrons excited by the laser beams have enough time to transfer energy to the crystal lattice and heat the material up to melting, and then vaporization, temperatures. The laser damage to the material is large. When the laser pulse duration is above 10 picoseconds and below 1 nanosecond, the pulse duration is at the same time scale of electrons transferring energy to lattices. The energy is transferred by thermal diffusion. The materials surrounding the laser irradiation are heated up and a liquid phase may exist during laser irradiation. However, the laser caused damage size is smaller than the laser a duration of nanoseconds. When a femtoseconds laser (e.g., <10 ps) is used, the electrons excited by the laser have no time to transfer the energy to the lattice. The materials undergo a solid-vaporization transition. The laser-caused damage in the materials is localized and smaller than the pico- and nano-second laser damage. The femtosecond laser damage can be smaller than a micrometer. According to a femtosecond ablation model for metal, the damage threshold of the laser fluence or the fluence threshold ($F_{th}$) that makes a solid directly change to vapor is approximately equal to $\rho\Omega/\alpha$, where $\rho$ is the density, $\Omega$ is the latent heat of evaporation per unit, and $\alpha$ is the absorption coefficient [6]. This model may not be accurate for semiconductors because electrons in metals and semiconductors are in different energy bands. However, it indicates the tendency of the damage threshold versus the absorption coefficient, i.e., the higher the absorption coefficient, the lower the laser damage threshold. In addition, the damage depth $d=\alpha^{-1}\ln(F/F_{th})$, where F is the absorbed laser fluence and $F_{th}$ is the threshold laser fluence, applies to many materials including glass, semiconductors, and metals. A high absorption coefficient makes the damage shallower because laser intensity decreases quicker in higher absorption materials. Therefore, limiting the laser damage to within the ion damaged layer is possible. The damage depth can also be used for estimating an upper limit of laser fluence ($F_m$)

$$F_m = F_{th} e^{\alpha d} \quad (1)$$

where d is the thickness of the ion damaged layer. A laser fluence above $F_m$ may cause the laser damage size to be larger than the ion damage range, while a fluence below $F_m$ may limit the laser damage to within the ion damage layer.

For an example, the absorption coefficient of a 4H conductive SiC wafer at wavelength 532 nm that was implanted with $6\times10^{16}$ protons/cm$^2$ is estimated at 75,205 cm$^{-1}$, 3836 times higher than its original one, based on a report [7]. The upper limit is estimated to be $F_m=3.1F_{th}$. The numerical aperture (NA) of optical system also has impacts on $F_{th}$.

After ion implantation, a short pulse laser (e.g., with a duration less than tens picoseconds) is irradiated to the ion damaged layer through either the top surface or bottom surface of the crystalline object. The wavelength of the laser is greater than the absorption edge of the material from which the crystalline object is formed, so that the laser beam can pass through the material to reach and be focused at the ion damaged layer inside the object. Because the ion damaged layer has different transmittance and absorption spectra from that of the undamaged material, the laser beam is absorbed by the materials in the ion damaged layer, making the removal of the film from the crystalline object easier than using ion implantation only.

An embodiment comprises a method of separating a film from a crystalline object, the crystalline object comprising at least one material, the method comprising: implanting ions into the crystalline object through a surface to form an ion damaged layer underneath the surface; irradiating the crystalline object with amplified light, the light having a wavelength above an absorption edge of the at least one material, the light having a pulse with a duration lower than about 10 picoseconds, the light further damaging at least a portion of the ion damaged layer; and separating the film of the crystalline object from a main body of the crystalline object at the location further damaged by the amplified light.

Implementation of this embodiment include: wherein the amplified light is focused on the ion damaged layer to cause further damage to the ion damaged layer or crystalline material proximate to the ion damaged layer; wherein the amplified light is focused past the ion damaged layer and the fluence of the amplified light is between a fluence threshold of the ion damaged layer and a fluence threshold of at least one undamaged material of the crystalline object, causing further damage to the ion damaged layer; wherein the amplified light enters the crystalline object through the same surface the ions were implanted; wherein the amplified light enters the crystalline object through an opposite surface from the surface through which the ions were implanted; wherein the amplified light is focused away from the ion damaged layer to destruct non-ion damaged material of the crystalline object, wherein the ion damaged layer functions as a buffer layer to reduce damage outside the focusing point; wherein the crystalline object comprises oxide compound crystal, semiconductor crystal, metal crystal, halide compound crystal, or combinations thereof; wherein the crystalline object comprises one or more of SixGe1-x, InxGa1-xAs, InxGa1-xP,Ga2O3, ZnO, CdxZn1-xTe, SiC, diamond, and AlxInyGa1-x-yN, where $0 \le x \le 1$, $0 \le y \le 1$, and $0 \le 1-x-y \le 1$; wherein the crystalline object comprises an epitaxial layer, electronic devices fabricated on the crystalline object, or electronic devices fabricated on an epitaxial layer; further comprising the step of depositing an epitaxial layer, fabricating devices, or depositing an epitaxial layer and fabricating devices on the surface of the crystalline object prior to irradiation with amplified light; further comprising the step of applying a supporting layer to the surface of the crystalline object; wherein the supporting layer is a stiff supporting layer; wherein the supporting layer is under tensile stress and introduces compressive stress to the film; wherein the compressive stress is generated during the application of the supporting layer to the film; wherein the compressive stress is generated by heating or cooling the supporting layer and the crystalline object after the supporting layer is applied; further comprising the step of applying a stressor to the opposite surface after irradiation with amplified light; wherein the implanted ions comprise ions of at least one of H, He, N, O, B, P, Al, Si, Mg, Ne, and Ar; wherein the supporting layer comprises one or more of metals, polymers, glass, mono crystalline materials, ceramics, and combinations thereof; wherein the crystalline object comprises an epitaxial layer with devices, and the supporting layer functions as one of an Ohmic contact layer and a Schottky contact layer with respect to one or more of the devices on the epitaxial layer; wherein the ion damaged layer is located at a depth of between about 0.1 μm and about 100 μm under the surface.

Another embodiment comprises a method of separating a film from a crystalline object, the crystalline object comprising at least one material, the method comprising: receiving a crystalline object that has been ion-implanted through a surface to form an ion damaged layer underneath the surface; irradiating the crystalline object with amplified light, the light having a wavelength above an absorption edge of the at least one material, the light having a pulse with a duration lower than about 10 picoseconds, the light further damaging at least a portion of the ion damaged layer; and separating the film of the crystalline object from a main body of the crystalline object at the location further damaged by the amplified light.

The details of one or more embodiments of the subject matter of this specification are set forth in the accompanying drawings and the description below. Other features, aspects, and advantages of the subject matter will become apparent from the description, the drawings, and the claims.

DETAILED DESCRIPTION

Various methods and systems are disclosed to separate a film from the main body of a substrate. Unlike previously known methods, the disclosed methods are usable on various crystalline materials.

Figure 1:
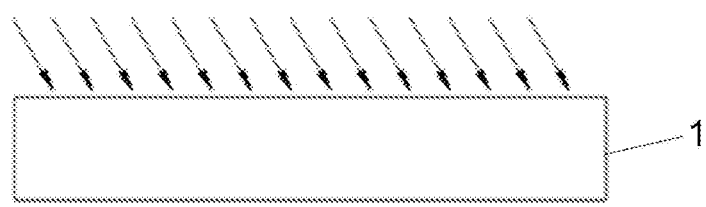
FIG. 1 shows a crystalline object with top and bottom surface being ion implanted through a top surface, according to an aspect of the present disclosure.
Figure 2:
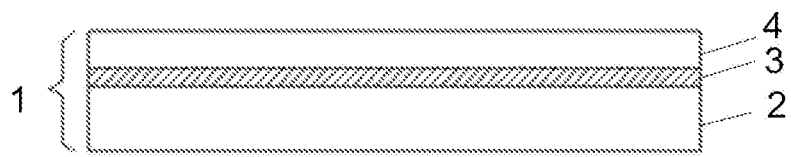
FIG. 2 shows a cross-section of an ion implanted crystalline object, according to an aspect of the present disclosure.

FIG. 1 shows a schematic cross-sectional illustration of ions being implanted through a top surface of a crystalline object 1, according to an embodiment of the present disclosure. The ion implantation causes a layer of the crystalline object to become damaged, as illustrated in FIG. 2. After ion implantation, the crystalline object 1 comprises several layers, including a main body 2, an ion damage layer 3 above the main body, and a substrate film 4 above the ion damaged layer 3.

The crystalline object may comprise one or more of semiconductors, oxide compounds (including corundum, e.g., sapphire), halide compounds, and metals. The crystalline object may be in the form of a thin slice or a thick chunk, in regular or irregular shapes, so long as at least one surface of the crystalline object is flat. The accompanying figures illustrate the crystalline object as having a top surface and a bottom surface, though only a single flat surface is required to practice the disclosed methods.

If the crystalline object is semiconductor, it may comprise one or more of $Si_xGe_{1-x}$, $In_xGa_{1-x}As$, $In_xGa_{1-x}P$, $Ga_2O_3$, ZnO, $Cd_xZn_{1-x}Te$, SiC, diamond, and $Al_xIn_yGa_{1-x-y}N$, where $0 \leq x \leq 1$, $0 \leq y \leq 1$, and $0 \leq 1-x-y \leq 1$. The crystalline object may comprise any polytypes or polymorphs of any listed material.

The ions are implanted into the crystalline object 1 through a flat surface, e.g., the top surface, causing the formation of an ion damaged layer underneath the surface of the crystalline object as illustrated in FIGS. 1 and 2. The direction of the incident ion beam may be either vertical or a few degrees away from vertical of the low Miller index planes of the crystal, such as (001), (011), (111), etc. Having the incident ion beam away from vertical helps to avoid a channel effect, in which the ions penetrate much deeper into the crystal by moving through the space between the atoms of the crystal and avoiding a collision. If the ion beam is at an angle, the ions are much more likely to collide with the atoms of the material and will stop at the predicted depth. In one embodiment, the direction of the ion beam may be at an angle sufficient to avoid the channel effect, e.g., about 7 degrees in a particular embodiment.

The implanted ions under the surface of the semiconductor substrate 1 form an ion damaged layer 3. The ion energy and dose used will depend on the material(s) in the crystalline object, the type of ion(s), the desired depth of the ion damage layer, and the amount of damage desired to be introduced to the crystalline object, among other factors. The ion implantation depth is correlated with the implantation energy, e.g., an increase in ion implantation energy increases the implantation depth. In addition, some materials, e.g., SiC, etc., will require a higher ion energy to achieve the same depth as less hard materials, e.g., Si, etc.

In one embodiment, the energy of the ion implantation may range from about 10 keV to about 3 MeV, e.g., between about 200 keV and about 1 MeV, and more particularly, between about 200 keV and about 300 keV, in a preferred embodiment for, e.g., hard materials like SiC. In one embodiment, the ion implantation depth may range from about 0.1 μm to about 100 μm, preferably less than about 20 μm.

The dose of the implantation affects the amount of damage done to the crystalline object, where a higher dose causes a higher amount of damage. In one embodiment, the ion implantation dose may range from about $1 \times 10^{12}$ ions/cm$^2$ to about $5 \times 10^{20}$ ions/cm$^2$, e.g., between about $1 \times 10^{16}$ ions/cm$^2$ and about $5 \times 10^{17}$ ions/cm$^2$, and more particularly, between about $1 \times 10^{16}$ ions/cm$^2$ and about $3 \times 10^{16}$ ions/cm$^2$, in a preferred embodiment for, e.g., hard materials like SiC and GaN implanted with H and/or He.

In an embodiment, the implanted ions include ions of at least one of H and He. Alternatively, ions used as dopants, e.g., ions of N, O, Ar, B, Si, Al, P, and/or Mg, may be used for ion implantation, but may cause additional surface damage that would need to be repaired. If a larger ion is used for ion implantation, a lower dose may be preferred. Such a dose may be in the range of about $1\times10^{12}$ ions/cm$^2$ to about $1\times10^{16}$ ions/cm$^2$.

When ions of H and/or He are used for ion implantation, the ion damaged layer may be heat annealed to enhance the effect of the ion damage. Heat annealing has been shown to cause the creation and/or enhancement of micro bubbles or platelets at the ion damaged layer after ion implantation of H and/or He. The annealing temperature depends on the material(s) used in the crystalline object. For SiC, the annealing temperature may be greater than about 650° C. [2,3].

The damage to the ion damaged layer 3 alters the optical transmittance and absorption of the layer. The ion damaged materials become more absorptive, especially at wavelengths closer to the absorption edge of the object's original materials [4,5,7]. This allows a laser with a wavelength above the absorption edge of the crystalline object, but still absorbed by the ion damaged layer, to cause further damage to the ion damaged layer 3, but minimal damage to the un-ion damaged portion of the crystalline object. This additional damage increases the ease of removal of the film 4.

Figure 3:
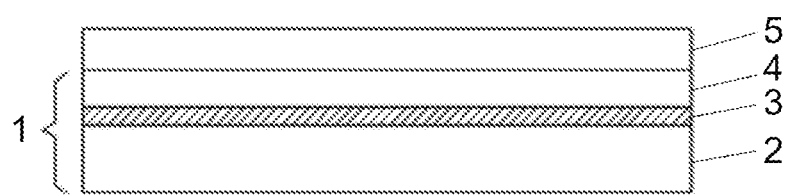
FIG. 3 shows a cross-section of an ion implanted crystalline object including an epitaxial layer, according to an aspect of the present disclosure.

In one embodiment, a functional layer (e.g., devices, epitaxial layer, epitaxial layer with devices) may be directly formed on the film 4, as shown in FIG. 3. The functional layer 5 may be fabricated or deposited on the top surface of the substrate prior to ion implantation, if the devices comprising the functional layer are not sensitive to the ion irradiation. Alternatively, the functional layer can be formed on the top surface of the substrate after ion implantation. The devices may be micro-electronic mechanical devices (MEMS) or electronic devices (e.g., metal oxide semiconductor (MOS), metal oxide semiconductor field effect transistor (MOSFET), etc.). The functional layer may be formed by any suitable deposition process, including but not limited to, chemical vapor deposition (CVD), plasma enhanced chemical vapor deposition (PECVD), metal-organic chemical vapor deposition (MOCVD), molecular beam epitaxy (MBE), vapour phase epitaxy (VPE), hydride VPE, metalorganic VPE, physical vapor transport (PVT), physical vapor deposition (PVD), liquid phase epitaxy (LPE), pulse laser deposition(PLD), atom layer deposition (ALD), etc.

The functional layer 5 may comprise a single structure or multiple structures. The functional layer 5 may comprise at least one of Si, Ge, $Si_xGe_{1-x}$, SiC, GaAs, InP, $In_xGa_{1-x}As$, $Cd_xZn_{1-x}Te$, ZnO, $Ga_2O_3$, diamond, AlN, GaN, InN, or $Al_xIn_yGa_{1-x-y}N$, where $0 \leq x \leq 1$, $0 \leq y \leq 1$, and $0 \leq 1-x-y \leq 1$. In one embodiment, x and y can vary gradually or abruptly in the epitaxial semiconductor layer of $Al_xIn_yGa_{1-x-y}N$. The conductivity and conductive type such as p or n type in the functional layer may be controlled by means of dopants.

When the functional layer 5 is formed on the film 4 after ion implantation, the surface of the film on which the functional layer is formed needs to have minimal surface damage from the ion implantation, e.g., blistering, exfoliation, or crystal structure damage. The film 4 can also be separated from the main body 2 of the crystalline object without a functional layer. In the remaining description, if not specified, reference to the film 4 includes films with a functional layer and films without a functional layer.

Figure 5:
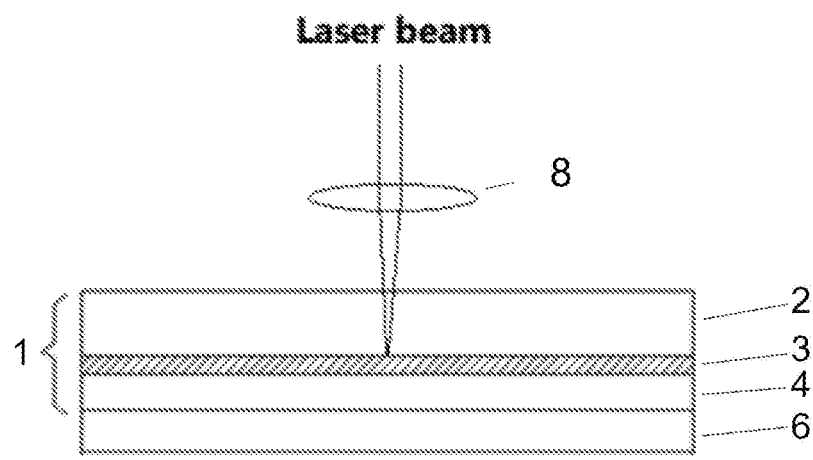
FIG. 5 shows focused laser beam irradiation of the ion damaged layer through the bottom surface of an ion implanted crystalline object, according to an aspect of the present disclosure.
Figure 6:
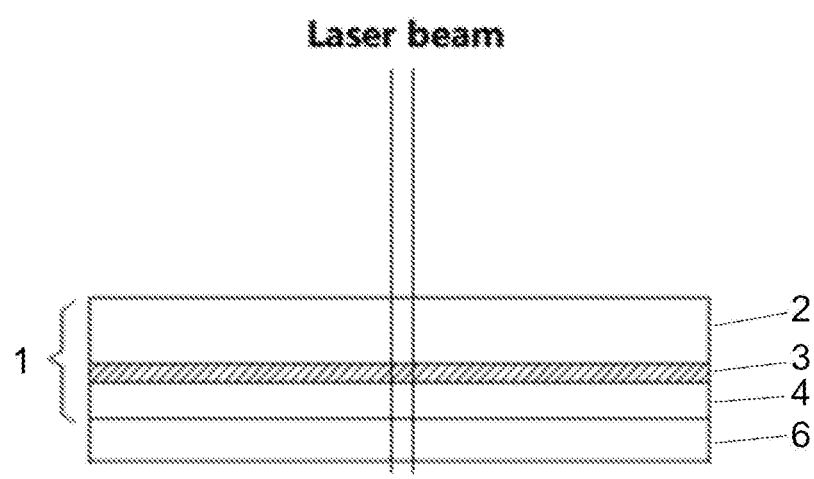
FIG. 6 shows unfocused laser beam irradiation of the ion damaged layer through the bottom surface of an ion implanted crystalline object, according to an aspect of the present disclosure.

After ion implantation, the film is irradiated by a short pulse laser beam for separation, as shown in FIG. 5 and FIG. 6. The laser beam preferably has a duration less than ten picoseconds, more preferably less than 1 picosecond. A laser beam with a duration in femtoseconds can cause damage in the materials smaller than 1 micrometer without transferring heat to the surrounding materials.

Although a laser with high fluence can achieve separation, laser fluence between the one determined by eq. (1) and higher than the threshold of the ion damaged material is preferred, so that the damage caused by the laser only happens in the ion damaged layer. Either a single laser pulse or multiple laser pulses can be used. A single pulse laser will have a higher fluence threshold than that of a multi-pulse laser. The fluence threshold for a multi-pulse laser is defined as $F_{th}(N)=F_{th}(1)N^{S-1}$, where N is the number of laser pulse, $F_{th}(1)$ is the fluence threshold for the first laser pulse, and S is a material related constant that is less than 1. S is typically determined by experiment. If a muti-pulse laser is used the fluence threshold and maximum fluence should be considered accordingly.

The laser beam travels through the optical lens 8, which focuses the beam at the targeted layer of the crystalline object. The reader will note that the crystalline object has been flipped in FIGS. 5 and 6, and the laser beam is irradiating the object through the bottom surface of the main body 2.

The wavelength of the laser is chosen to be longer than the absorption edge of the material of crystalline object so that laser beam may non-destructively pass through the main part of the crystalline object and reach the ion damaged layer. The wavelength of the laser is also chosen so that the ion destructed crystalline material would have high absorption, so that the energy of the laser is absorbed mostly by the ion damaged layer. The exact wavelength of the laser will vary according to the type of material in the crystalline object and the absorption and/or transmission spectra of the ion-damaged layer. Because the ion damaged layer has different absorption and transmission spectra from the non-ion damaged material of the crystalline object, a laser wavelength satisfying the above criteria can generally be found when the ion damaged material is more absorptive than the non-ion damaged material. An example semi-insulating, un-ion implanted wafer of SiC may have an absorption edge at approximately 380 nm. Note that this value is for example only, and different polytypes of SiC may have different transmittance and absorption spectra. Similarly, the dopant used (e.g., in doped SiC) may also affect the transmittance and absorption spectra.

After ion implantation, the ion damaged layer is more absorptive than the main body of SiC. Since the optical absorption of the ion damaged material reduces as the wavelength increases [4,5,7], a laser with a wavelength close to original absorption edge is preferred. For an example, a laser wavelength of about 510 nm may be used. In one embodiment, suitable wavelengths for irradiation of a semi-insulating, ion damaged SiC crystal are between about 400 nm and 800 nm. However, for N doped conductive 4H SiC the suitable wavelength are between about 480 nm and about 800 nm.

As another example, an un-ion implanted wafer of Si may have an absorption edge at approximately 1130 nm. After ion implantation, the ion damaged layer is more absorptive than the main body of Si, and a laser wavelength of 1500 to 2000 nm may be used.

The crystalline object can be irradiated from either a bottom or a top surface if no devices are fabricated on the film. Although the material in the film 4 may have experienced some ion damage from the ion implantation, most of the ion damaged material will be located in the ion damaged layer. The laser can pass through the film with minor intensity loss and reach the ion damaged layer from the top surface of the crystalline object. The laser beam is thus absorbed by the materials in the ion damaged layer.

The laser may also irradiate through the bottom surface, as shown in FIGS. 5 and 6, since the bottom surface and main body 2 will have sustained almost no damage from the ion implantation. The laser can pass through the main body with minor intensity loss and reach the ion damaged layer from the bottom surface of the crystalline object. Also, if a functional layer 5 has been deposited on the top surface, irradiating through the bottom surface of the crystalline object can prevent damage to the functional layer and/or the devices in the functional layer, because the laser energy is absorbed by the ion damaged layer.

In an alternative embodiment, the laser may be focused past the ion damaged layer, e.g., at a non-ion damaged part of the crystalline object, or outside of the crystalline object. As long as the laser fluence is above the fluence threshold of the ion damaged layer, the laser will still cause further destruction at the ion damaged layer as the laser passes through the layer. Furthermore, the width of the laser beam as it passes through the ion damaged layer is greater than if the laser was focused at the ion damaged layer, which can speed the destruction process as more area of the ion damaged layer is affected per unit of time. An unfocused laser (with parallel light rays) may also be used to achieve this effect, as illustrated in FIG. 6.

The laser irradiation further damages the ion damaged layer and/or the crystal structure nearby the ion damaged layer, and makes the separation of the film 4 from the main body 2 easier than using ion implantation only. This is especially so in the case where the ion dose is low due to either low energy capability or low ion current capability of the ion implanter and thus there may be difficulty in separating the film from the main body.

Figure 4:
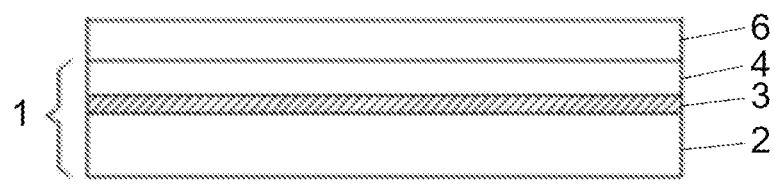
FIG. 4 shows a cross-section of an ion implanted crystalline object including a supporting layer, according to an aspect of the present disclosure.

In some embodiments, a supporting layer 6 may be applied on top of the film before or after laser irradiation, as shown in FIG. 4. If the supporting layer is applied before laser irradiation, the separation of the film 4 from the main part 2 of the crystalline object 1 may take place during or after laser irradiation.

The purpose of the supporting layer 6 is to support the film because the film 4 may not be a free standing film in some applications. The supporting layer may be a stiff substrate or be a bendable and stressed layer that can also serve as a stressor. A stressor is usually used when the separation of film 4 from the main body 2 is performed after laser irradiation.

In some embodiments, a stressor may be applied on top of the film 4, on the bottom surface of the crystalline object, or both. The function of the stressor is to induce compressive stress in the film 4 and/or main body 2 such that the main body 2 and the film 4 can be more easily separated. When a stressor is applied on the bottom surface, the compressive stress is introduced to the main body 2. The stressor itself is subject to a tensile stress, and induces a compressive stress into the film.

In some embodiments, the supporting layer may be a stiff substrate such as mono crystalline materials, ceramics, glass, polymers, or metals. When a stiff substrate is used the supporting layer may be applied by direct bonding or bonding with an intermediate material. Direct bonding describes the process of bonding two wafers together without any intermediate material. Direct wafer bonding includes, but is not limited to: fusion bonding; high and low temperature; chemical activation; plasma activated bonding; anodic bonding; and silicon-glass laser bonding. Bonding with intermediate material includes, but is not limited to: thermo-compression bonding; eutectic bonding; polymer bonding; metal-metal bonding; solder bonding; and glass frit bonding.

A stiff supporting layer may be applied on the film 4 before laser irradiation if the separation of film 4 from the main body 2 takes place once the laser irradiation is finished. A stiff supporting layer may also be applied on the film 4 before or after laser irradiation if a stressor is applied on the bottom surface after laser irradiation. In embodiments where stress is generated during application of a stressor, the stiff supporting layer is preferred to be applied before the stressor because the stressor may cause curvature of the crystalline object. In embodiments using a CTE stressor (i.e., a stressor that applies stress when the crystalline object is heated or cooled because of the difference between the coefficients of thermal expansion (CTEs) of the stressor and the crystalline object), the stiff supporting layer can be applied before or after the stressor is applied. A CTE stressor can be applied on film 4 before laser irradiation because it does not generate stress before temperature changes.

When the laser is focused on the ion damaged layer, some of the factors to consider when deciding the order in which to perform the laser irradiation and apply the supporting layer and stressor are: i) maintaining quality of the film 4; ii) preventing or limiting curvature of the crystalline object before laser irradiation; and iii) introducing stress right before or during separation. For example, a stressor applying stress on the bottom surface of crystalline object can make it bend, causing difficulty in applying a stiff supporting layer to the film 4. Another example is a stressor applying stress on the film 4 before laser irradiation can cause the crystalline object to curve, in turn causing the laser to be out of focus.

When the laser is unfocused, or not focused on the ion damaged layer, these restrictions are unnecessary, and the supporting layer and/or stress inducing layer may be applied in any order.

The stressor may comprise metals, polymers (e.g., a non-metal epoxy), or mixtures thereof. The metal materials used in the stressor may be one or more of Ni, Au, Cu, Pd, Ag, Al, Sn, Cr, Ti, Mn, Co, Mg, Zn, Mo, W, Zr, V, Pt, Fe, and alloys thereof.

The stressor may be applied in a variety of ways including, but not limited to, by means of sputtering, vaporization, vapor coating, electroplating, spin coating, brush coating, taping, or brushing, in addition to the methods for applying the supporting layer described above. The stress may be generated as the stressor is applied to the film. Alternatively, the stress may be generated by cooling or heating the stressor and crystalline object after the stressor is applied. The difference between the CTE of the stressor and the CTE of the crystalline object causes compressive stress in the crystalline object. If cooling is required, a cryogenic system can be used.

Figure 7:
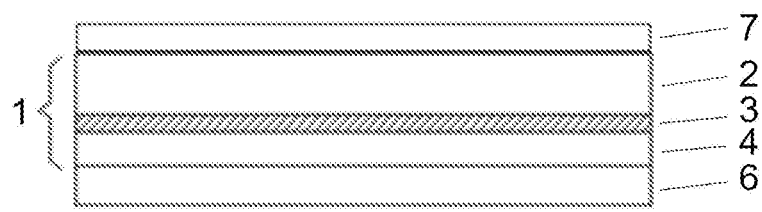
FIG. 7 shows a cross-section of an ion implanted crystalline object including a stressor applied to the bottom surface of the ion implanted crystalline object, according to an aspect of the present disclosure.

If the separation of the film 4 from the main body 2 happens after laser irradiation, a stressor may need to be applied on top of the film, on the bottom surface of the crystalline object, or both. In the case where the stressor is applied on the top of the film, the stressor doubles as the supporting layer. If the stressor is applied to the bottom of the crystalline object, the film may need to be supported by a stiff substrate as described above. FIG. 7 illustrates an example of a stiff support 6 applied to the film 4 with a stressor 7 being applied to the bottom surface of the crystalline object 1. In the case where stressors are applied to both the top and the bottom, they may pull in opposite directions to help separation.

In embodiments where the stressor doubles as the stiff supporting layer and the stressor/supporting layer is applied before laser irradiation, the stressor may be a CTE stressor, with the stress being caused during heating or cooling of the crystalline object.

In one embodiment, a vacuum, e.g., created by a vacuum chuck, holding a thin supporting layer, e.g., a thin metal or polymer, on top of the film can substitute for the stiff supporting layer.

The stressor may also function as an Ohmic contact or Schottky contact layer when it is metallic. For example, a stressor above p-GaN in a LED structure may function as an Ohmic electrode while a stressor above n-type epitaxial layer for SiC diode can function as a Schottky contact layer.

If the film 4 was not separated from the main body 2 of the crystalline object 1 during laser irradiation, the separation occurs after any supporting layers 6 and/or stressors 7 are applied. The separation may be initiated by applying a pulling force on the supporting layer and/or stressor. When the supporting layer is a stressor, an adhesive tape may be applied to the supporting layer. By pulling the tape, the film may be separated from the main body of the substrate. When the supporting layer is a stiff substrate, two vacuum chucks may be attached to supporting layer and the bottom of the crystalline object. By pulling the vacuum chucks in opposite directions, the film and the main body of the crystalline object may be separated.

The laser irradiation of the crystalline object may be pulsed. The pulse duration is less than tens of picosecond, preferably less than 10 ps, because with such a short pulse, excited electrons do not have enough time to transfer heat to the lattice of the materials and thus the laser damage is limited to within the size of laser beam. Laser fluence may be in the range that achieve film separation and cause minimum side impact to the film. Preferably, laser fluence is between the threshold determined by eq(1) and higher than the threshold of ion damaged material that is mainly located in ion damaged layer. A single pulse or multiple pulses may be used. The damage threshold of a single pulse laser is higher than the threshold of a muti-pulse laser.

The disclosed methods have numerous advantages over the prior art. With laser assistance, the thickness of the stressor and stress from the stressor can be reduced or eliminated compared to prior techniques. Since the ion damaged layer in the crystalline object has a damaged crystal structure with greater absorption characteristics, laser irradiation with suitable laser fluence and pulse duration can limit the extent laser damage, including negative impact to the functional layer (e.g., epitaxial layer, devices, or epitaxial layer with devices) on the film. In some embodiments, the additional damage to the ion implanted layer caused by the laser may be sufficient to enable separation of the film from the main body of the crystalline object without any additional stressor. The disclosed methods can also generate thinner films than prior methods.

As an example, a 4H poly semi-insulating type SiC wafer is ion implanted at 200 keV and $3 \times 10^{16}$ protons/cm$^2$. After proton implantation the transmittance of laser light with wavelength of 520 nm (which is above the absorption edge of SiC) drops from about 61% originally to about 27%. The absorption coefficients are 1.92 cm$^{-1}$ and 28,300 cm$^{-1}$, respectively. $F_m=2.34F_{th}$ can be used for laser fluence estimation assuming that the thickness of ion damage layer is 300 nm. The GaN and AlGaN epitaxial layers are then deposited on the SiC substrate for high electron mobility transistor (HEMT) fabrications. After HEMT fabrication the top surface can be bonded to a stiff glass by polymer bonding (adhesive bonding). Then a laser beam at a wavelength of 520 nm and a pulse duration of 350 fs is focused on the ion damaged layer from the bottom side of the wafer to separate the film off the wafer. The $F_{th}$ for the ion damaged layer is smaller than that for the undamaged part. The same value of $F_{th}$ for undamaged SiC can be used for separation and without causing damage to undamaged materials when the laser is focused at ion damaged layer. The separated film can be diced and then bonded to a metal substrate as a film supporter and heat sink. The top glass support can then be removed.

As another example, a Si wafer is ion implanted at 400 keV and $2 \times 10^{16}$ protons/cm$^2$. MOSFET devices are built on the ion implanted Si wafer. A support layer with the additional function of a CTE stress layer is applied on top of MOFET devices. A 1200 nm wavelength 150 fs laser can be used for irradiation. 5 J/cm$^{-2}$ laser fluence can be used since 5.17 J/cm$^{-2}$ was reported as $F_{th}$ for undamaged Si. After laser irradiation, a liquid nitrogen shower is applied on the stress layer to cause separation of the film from the main body of Si substrate.

The methods disclosed herein can be used on many different types of crystalline objects, including oxide compound crystals such as LiNbO$_3$ or LiTaO$_3$. In such an application, surface acoustic (SAW) devices may be built on the crystalline object. Additionally, the disclosed method may be used to separate oscillator devices from quartz crystals.

Figure 8:
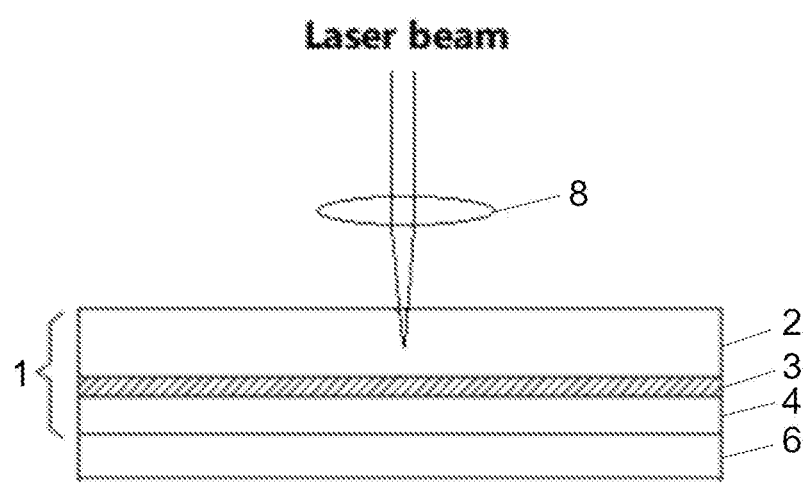
FIG. 8 shows laser beam irradiation of a non-ion damaged section of an ion implanted crystalline object, according to an aspect of the present disclosure.

In an alternative embodiment, laser beams may be focused at non ion damaged locations, as illustrated in FIG. 8. In this case the laser pulse duration may be from femtoseconds to nanoseconds. The ion damaged layer 3 may at least partially block the heat shock caused by the laser when the laser beam is irradiated from bottom side. Because of the damage to the crystalline structure in the ion damaged layer, the ion damaged layer may function as a buffer layer to prevent damage extension, i.e., it may shorten the range of sub surface damage (SSD) or thermo shocks. In this case, the higher the ion dose, the better the buffer effect of the ion damage layer. The separation will happen at the laser focused layer. In this case stressors will need to be applied to the top and/or bottom of the crystalline object to cause separation. This may generate thinner materials than prior methods.

Various embodiments are described in this specification, with reference to the detailed discussed above, the accompanying drawings, and the claims. Numerous specific details are described to provide a thorough understanding of various embodiments. However, in certain instances, well-known or conventional details are not described in order to provide a concise discussion. The figures are not necessarily to scale, and some features may be exaggerated or minimized to show details of particular components. Therefore, specific structural and functional details disclosed herein are not to be interpreted as limiting, but merely as a basis for the claims and as a representative basis for teaching one skilled in the art to variously employ the embodiments.

The detailed description and drawings of the present disclosure are only for further explanations of the principles and specialties of the patent. They do not restrict the ranges of this patent therein. Furthermore, any reference to singular includes plural embodiments, and any reference to more than one component may include a singular embodiment.

The embodiments described and claimed herein and drawings are illustrative and are not to be construed as limiting the embodiments. The subject matter of this specification is not to be limited in scope by the specific examples, as these examples are intended as illustrations of several aspects of the embodiments. Any equivalent examples are intended to be within the scope of the specification. Indeed, various modifications of the disclosed embodiments in addition to those shown and described herein will become apparent to those of ordinary skill in the art, and such modifications are also intended to fall within the scope of the appended claims.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

All references including patents, patent applications and publications cited herein are incorporated herein by reference in their entirety and for all purposes to the same extent as if each individual publication or patent or patent application was specifically and individually indicated to be incorporated by reference in its entirety for all purposes.

The following references are incorporated by reference in their entirety:

[1] B. Hu, et al., Separation of a functional film from a SiC substrate by ion cut without bonding.

[2] M. Goosky editor, Ion Implantation, p. 364.

[3] Q. Jia, et al., Freestanding ultrathin single-crystalline SiC substrate by MeV H ion-slicing.

[4] V. P. Amarasinghe, et al., Optimization of H+ Implantation Parameters for Exfoliation of 4H—SiC Films.

[5] M. Buddle, Hydrogen-Related Deffects in Proton-Implanted Silicon and Germanium—An Infrared Absorption Spectroscopy Study, p. 5.

[6] B.N. Chicbkov, et al., Femtosecond, picosecond and nanosecond laser ablation of solids.

[7] T. Ozel, et al., Nanosecond Pulsed Laser Processing of Ion Implanted Single Crystal Silicon Carbide Thin Layers.

What is claimed is:

1. A method of separating a film from a crystalline object, the crystalline object comprising at least one material, the method comprising:
  implanting ions into the crystalline object through a surface to form an ion damaged layer underneath the surface;
  irradiating the crystalline object with amplified light, the light having a wavelength above an absorption edge of the at least one material, the light having a pulse with a duration lower than about 10 picoseconds, the light damaging at least a portion of the crystalline object;
  applying a supporting layer to the same surface of the crystalline object through which the ions were implanted;
  applying a stressor to a second surface of the crystalline object, wherein the second surface is distinct from the surface to which the supporting layer is applied, the stressor being under tensile stress and introducing compressive stress to the crystalline object; and
  separating the film of the crystalline object from a main body of the crystalline object at the location damaged by the amplified light.

2. The method according to claim 1, wherein the amplified light is focused on the ion damaged layer to cause further damage to the ion damaged layer or crystalline material proximate to the ion damaged layer.

3. The method according to claim 1, wherein the amplified light passes through but is not focused on the ion damaged layer and the fluence of the amplified light is between a fluence threshold of the ion damaged layer and a fluence threshold of at least one undamaged material of the crystalline object, causing further damage to the ion damaged layer.

4. The method according to claim 1, wherein the amplified light enters the crystalline object through the same surface the ions were implanted.

5. The method according to claim 1, wherein the amplified light enters the crystalline object through an opposite surface from the surface through which the ions were implanted.

6. The method according to claim 1, wherein the amplified light is focused away from the ion damaged layer to destruct non-ion damaged material of the crystalline object, wherein the ion damaged layer functions as a buffer layer to reduce damage outside the focusing point.

7. The method according to claim 1, wherein the crystalline object comprises oxide compound crystal, semiconductor crystal, metal crystal, halide compound crystal, or combinations thereof.

8. The method according to claim 1, wherein the crystalline object comprises one or more of $Si_xGe_{1-x}$, $In_xGa_{1-x}As$, $In_xGa_{1-x}P$, $Ga_2O_3$, $ZnO$, $Cd_xZn_{1-x}Te$, SiC, diamond, and $Al_{x-}In_yGa_{1-x-y}N$, where $0 \leq x \leq 1$, $0 \leq y \leq 1$, and $0 \leq 1-x-y \leq 1$.

9. The method according to claim 1, wherein the crystalline object comprises an epitaxial layer, electronic devices fabricated on the crystalline object, or electronic devices fabricated on an epitaxial layer.

10. The method according to claim 1, further comprising the step of depositing an epitaxial layer, fabricating devices, or depositing an epitaxial layer and fabricating devices on the surface of the crystalline object prior to irradiation with amplified light.

11. The method according to claim 1, wherein the supporting layer is a stiff supporting layer.

12. The method according to claim 1, wherein the compressive stress is generated during the application of the stressor to the crystalline object.

13. The method according to claim 1, wherein the compressive stress is generated by heating or cooling the stressor and the crystalline object after the stressor is applied.

14. The method according to claim 5, wherein the stressor is applied to the surface of the crystalline object opposite of the surface through which the ions are implanted.

15. The method according to claim 1, wherein the implanted ions comprise ions of at least one of H, He, N, O, B, P, Al, Si, Mg, Ne, and Ar.

16. The method according to claim 1, wherein the supporting layer comprises one or more of metals, polymers, glass, mono crystalline materials, ceramics, and combinations thereof.

17. The method according to claim 1, wherein the crystalline object comprises an epitaxial layer with devices, and the supporting layer functions as one of an Ohmic contact layer and a Schottky contact layer with respect to one or more of the devices on the epitaxial layer.

18. The method of claim 1, wherein the ion damaged layer is located at a depth of between about 0.1 μm and about 100 μm under the surface.

19. A method of separating a film from a crystalline object, the crystalline object comprising at least one material, the method comprising:
- receiving a crystalline object that has been ion-implanted through a surface to form an ion damaged layer underneath the surface;
- irradiating the crystalline object with amplified light, the light having a wavelength above an absorption edge of the at least one material, the light having a pulse with a duration lower than about 10 picoseconds, the light damaging at least a portion of the crystalline object;
- applying a supporting layer to the same surface of the crystalline object through which the ions were implanted;
- applying a stressor to a second surface of the crystalline object, wherein the second surface is distinct from the surface to which the supporting layer is applied, the stressor being under tensile stress and introducing compressive stress to the crystalline object; and
- separating the film of the crystalline object from a main body of the crystalline object at the location damaged by the amplified light.

20. The method of claim 1, wherein the supporting layer is under tensile stress and introduces compressive stress to the film.

* * * * *